United States Patent
Marciano et al.

(10) Patent No.: US 10,415,963 B2
(45) Date of Patent: Sep. 17, 2019

(54) ESTIMATING AND ELIMINATING INTER-CELL PROCESS VARIATION INACCURACY

(71) Applicant: KLA-Tencor Corporation, Milpitas, CA (US)

(72) Inventors: Tal Marciano, Yokneam (IL); Eran Amit, Haifa (IL); Barak Bringoltz, Rishon le Tzion (IL); Nuriel Amir, St. Yokne'am (IL); Amit Shaked, Karkur (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/727,038

(22) Filed: Jun. 1, 2015

(65) Prior Publication Data

US 2015/0292877 A1 Oct. 15, 2015

Related U.S. Application Data

(63) Continuation of application No. PCT/US2015/024999, filed on Apr. 8, 2015.

(60) Provisional application No. 61/977,537, filed on Apr. 9, 2014.

(51) Int. Cl.
*G06F 17/50* (2006.01)
*G01B 11/27* (2006.01)

(52) U.S. Cl.
CPC .......... *G01B 11/27* (2013.01); *G06F 17/5081* (2013.01)

(58) Field of Classification Search
CPC ............ G03F 9/00; H01L 22/00; G01B 11/00
USPC .................................................. 356/399–401
See application file for complete search history.

(56) References Cited

U.S. PATENT DOCUMENTS

| | | | |
|---|---|---|---|
| 6,716,646 B1 | 4/2004 | Wright et al. | |
| 7,170,604 B2 * | 1/2007 | Sezginer | G03F 7/70633 257/797 |
| 7,236,244 B1 * | 6/2007 | Yang | G03F 9/7065 257/797 |
| 7,656,528 B2 | 2/2010 | Abdulhalim et al. | |
| 7,671,990 B1 * | 3/2010 | Adel | G03F 7/70633 356/400 |
| 2005/0012928 A1 * | 1/2005 | Sezginer | G01B 11/26 356/401 |
| 2005/0195398 A1 * | 9/2005 | Adel | B82Y 10/00 356/401 |
| 2007/0229829 A1 | 10/2007 | Kandel et al. | |
| 2009/0279091 A1 * | 11/2009 | Levinski | G03F 7/70633 356/399 |
| 2012/0162647 A1 * | 6/2012 | Li | G03F 7/70633 356/399 |
| 2013/0293890 A1 * | 11/2013 | Amir | G01B 11/14 356/401 |

(Continued)

*Primary Examiner* — Isiaka O Akanbi
(74) *Attorney, Agent, or Firm* — Suiter Swantz pc llo

(57) ABSTRACT

Metrology methods and targets are provided, for estimating inter-cell process variation by deriving, from overlay measurements of at least three target cells having different designed misalignments, a dependency of a measured inaccuracy on the designed misalignments (each designed misalignment is between at least two overlapping periodic structures in the respective target cell). Inaccuracies which are related to the designed misalignments are reduced, process variation sources are detected and targets and measurement algorithms are optimized according to the derived dependency.

21 Claims, 7 Drawing Sheets

(56) References Cited

U.S. PATENT DOCUMENTS

2013/0342831 A1   12/2013  Levinski et al.
2014/0065736 A1*  3/2014  Amir ..................... H01L 23/544
                                                                     438/14

* cited by examiner

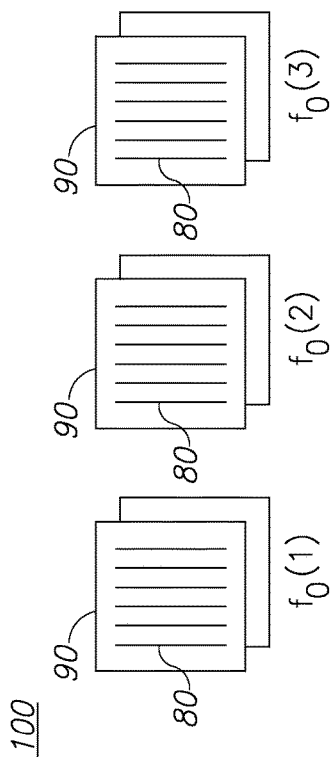
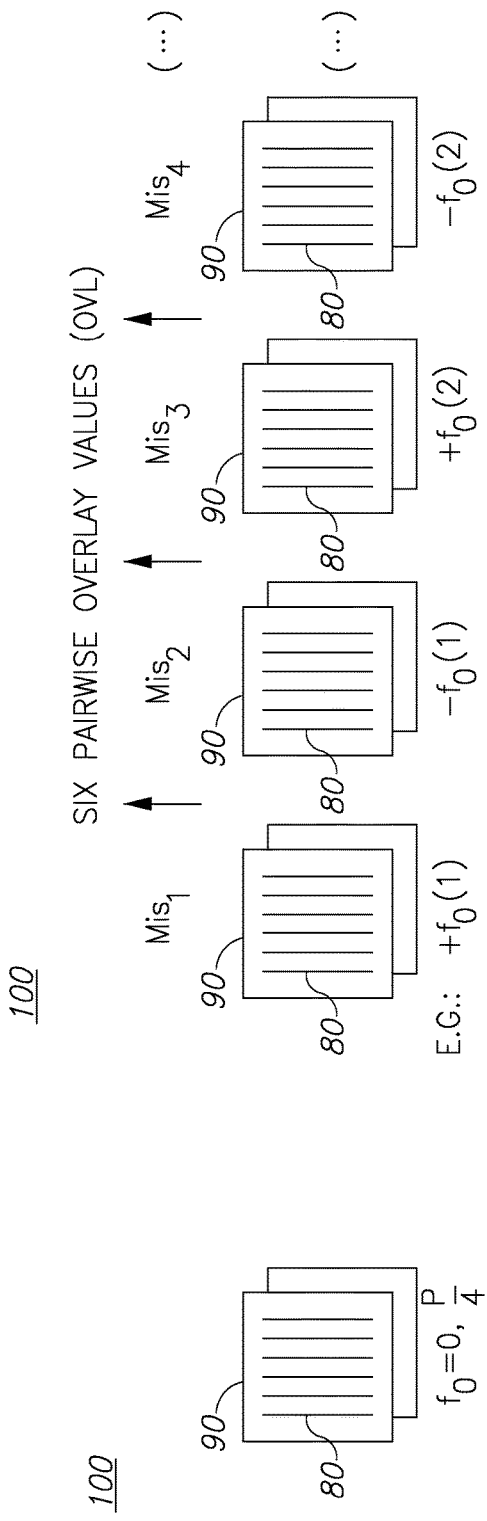

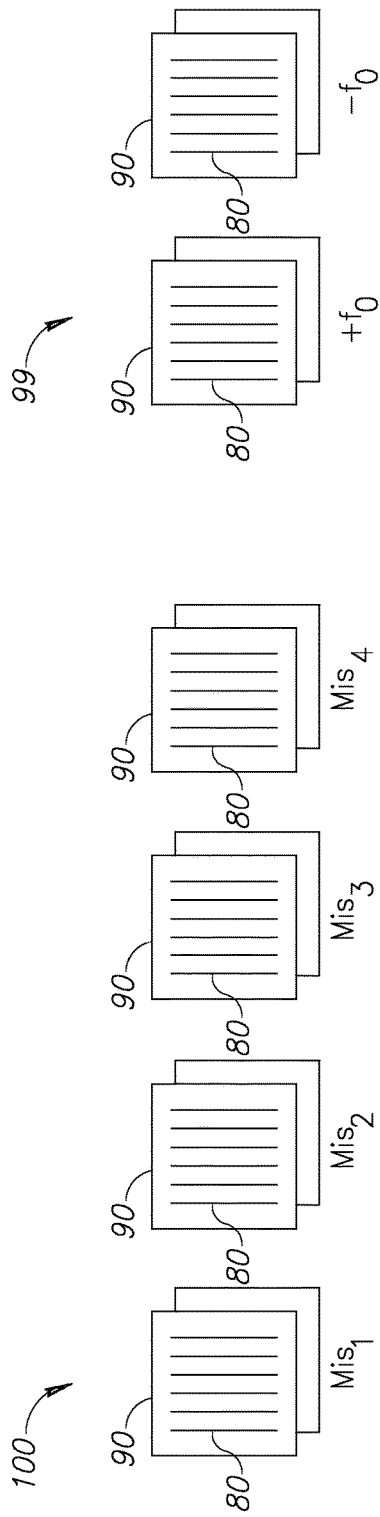
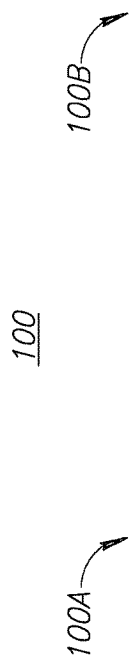
Figure 1D
Figure 1E

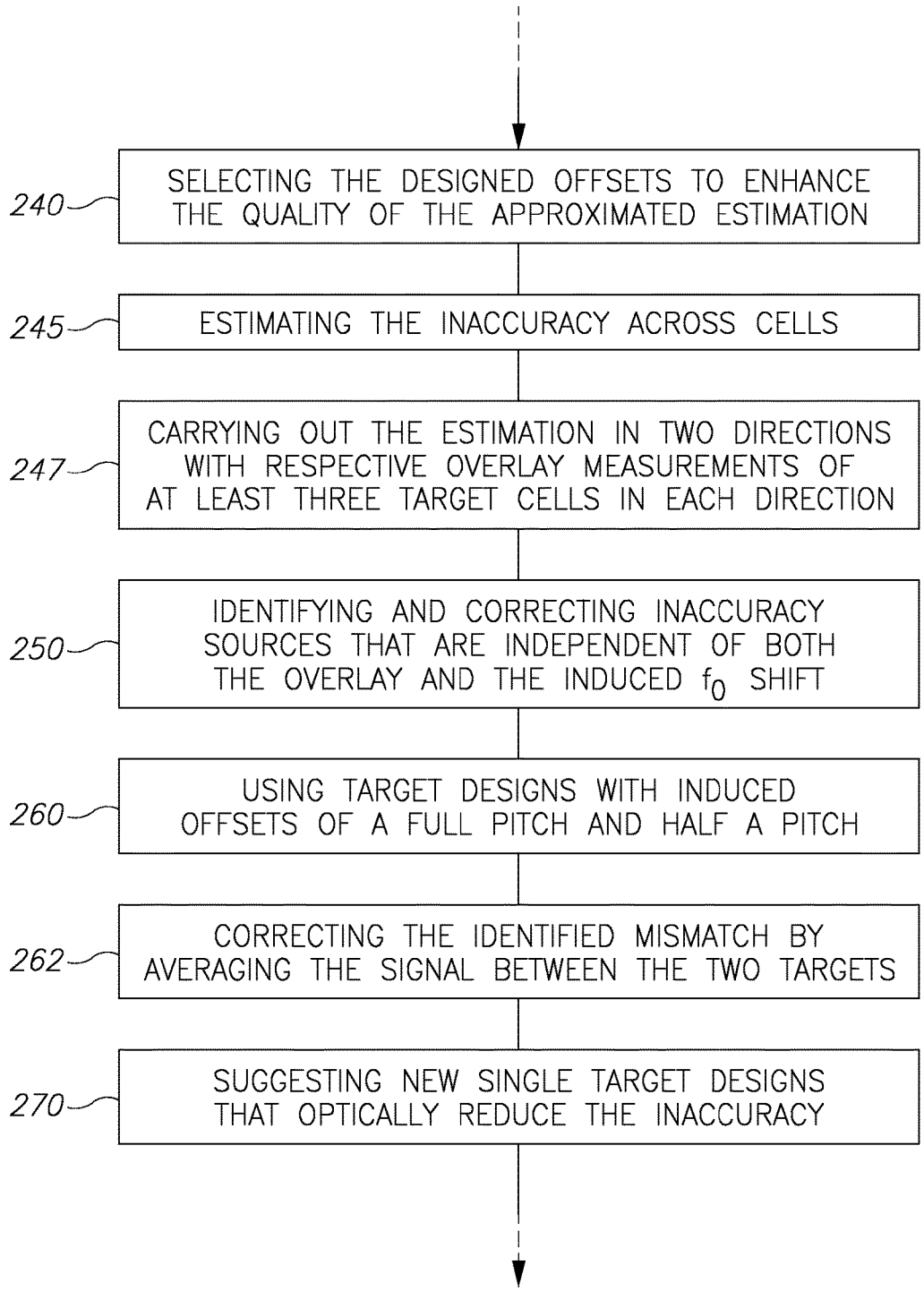
Figure 6 (cont. 1)

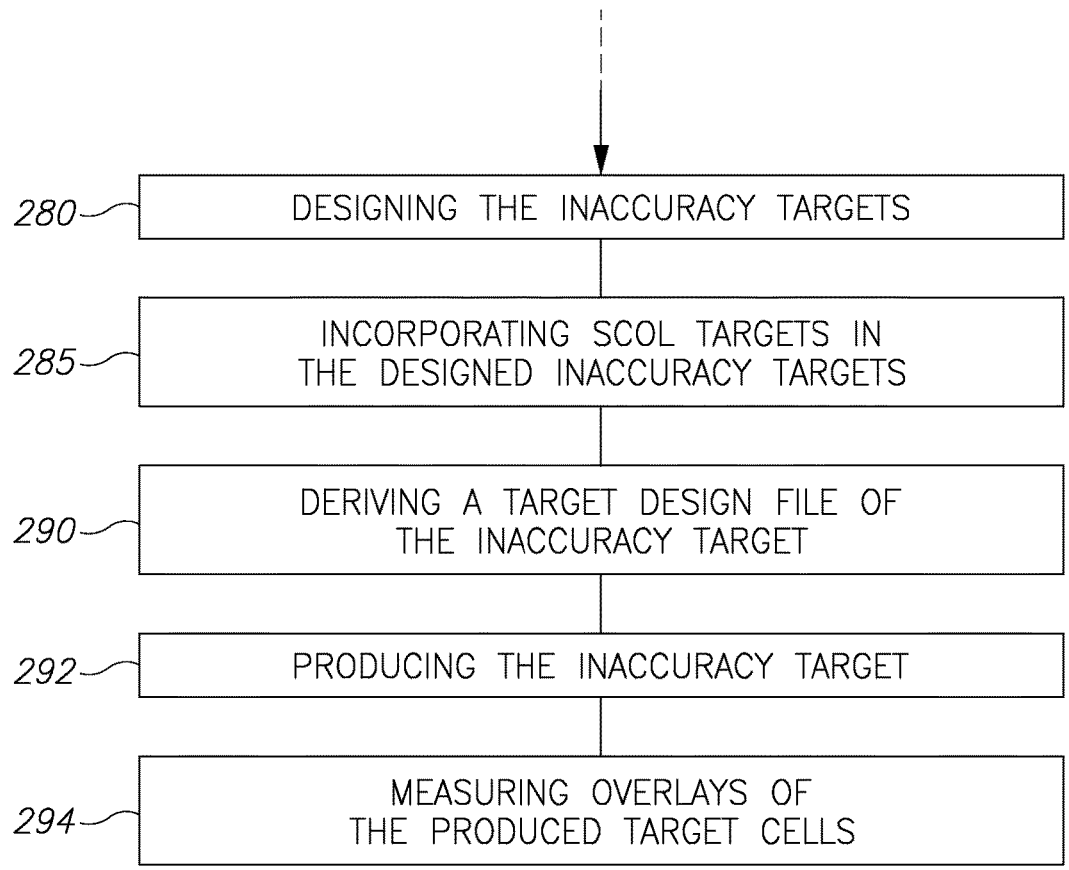
Figure 6 (cont. 2)

ESTIMATING AND ELIMINATING INTER-CELL PROCESS VARIATION INACCURACY

CROSS-REFERENCE TO RELATED APPLICATIONS

This application is filed under 35 U.S.C. § 111(a) and § 365(c) as a continuation of International Patent Application No. PCT/US2015/024999, filed on Apr. 8, 2015, which application claims the benefit of U.S. Provisional Patent Application No. 61/977,537, filed on Apr. 9, 2014, which applications are incorporated herein by reference in their entireties.

TECHNICAL FIELD

The present invention relates generally to the field of metrology, and, more specifically, to overlay scatterometry (SCOL) metrology.

BACKGROUND OF THE INVENTION

SCOL targets comprise several cells, each having two or more overlapping periodic structures with a same pitch and a designed offset between the structures. Diffraction signals from the SCOL targets are measured at the pupil plane to yield overlay measurements between the layers of in which the periodic structures are produced.

SUMMARY OF THE INVENTION

The present invention comprises a metrology method, including estimating inter-cell process variation by deriving, from overlay measurements of at least three target cells having different designed misalignments, a dependency of a measured inaccuracy on the designed misalignments, wherein each designed misalignment is between at least two overlapping periodic structures in the respective target cell.

The present invention also comprises a metrology module configured to estimate inter-cell process variation by deriving, from overlay measurements of at least three target cells having different designed misalignments, a dependency of a measured inaccuracy on the designed misalignments, wherein each designed misalignment is between at least two overlapping periodic structures in the respective target cell.

The present invention also comprises a method, including designing an inaccuracy target to comprise at least three target cells having different designed misalignments, wherein each designed misalignment is between at least two overlapping periodic structures in the respective target cell.

The present invention also comprises a metrology target, having at least three target cells having different designed misalignments, wherein each designed misalignment is between at least two overlapping periodic structures in the respective target cell.

The present invention also comprises a target design file of a metrology target having at least three target cells with different designed misalignments, wherein each designed misalignment is between at least two overlapping periodic structures in the respective target cell.

The present invention also comprises an overlay measurements assembly of a metrology target having at least three target cells with different designed misalignments, wherein each designed misalignment is between at least two overlapping periodic structures in the respective target cell.

The following is a simplified summary providing an initial understanding of the invention. The summary does not necessarily identify key elements nor limit the scope of the invention, but merely serves as an introduction to the following description.

One aspect of the present invention provides a method of estimating inter-cell process variation by deriving, from overlay measurements of at least three target cells having different designed misalignments, a dependency of a measured inaccuracy on the designed misalignments (each designed misalignment is between at least two overlapping periodic structures in the respective target cell).

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like reference characters designate corresponding elements or sections throughout.

In the accompanying drawings:

FIGS. 1A-1E are high level schematic illustrations of targets, according to exemplary embodiments of the invention;

DETAILED DESCRIPTION OF THE INVENTION

Figure 3A:
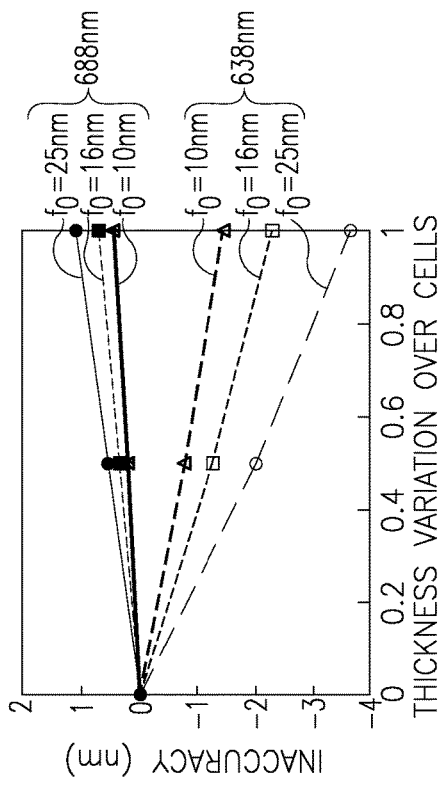
FIGS. 3A and 3B are graphical representations of simulation results for the inaccuracy as a function of the induced offset in targets with varying layer thickness between the target cells, according to some embodiments of the invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Furthermore, it is understood that this invention is not limited to the particular methodology, materials and modifications described and as such may, of course, vary. It is also understood that the terminology used herein is for the purpose of describing particular aspects only, and is not intended to limit the scope of the present invention, which is limited only by the appended claims.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

In the below description, an embodiment is an example or implementation of the invention. The various appearances of "one embodiment", "an embodiment", "certain embodiments" or "some embodiments" do not necessarily all refer to the same embodiments.

The terms "designed offset", "designed misalignment" or "intended misregistration values" as used in this application refer to a positional shift (denoted $f_0$ or $Mis_n$) between at least two overlapping periodic structures having the same pitch in a target cell. The term "opposite designed misalignments" as used in this application refers to misalignments in two target cells which are opposite in sign (i.e., $+f_0$ and $-f_0$ with $f_0$ being the designed misalignment). The term "scatterometry overlay (SCOL) target" as used in this application refers to a metrology target having at least two cells for each measurement direction which have opposite designed misalignments (denoted $+f_0$ and $-f_0$).

The term "overlay" as used in this application refers to a scatterometry signal at a pupil plane of a metrology tool which corresponds to a measured shift between at least two overlapping periodic structures having the same pitch in a target cell.

Metrology methods and targets are provided, for estimating inter-cell process variation by deriving, from overlay measurements of at least three target cells having different designed misalignments, a dependency of a measured inaccuracy on the designed misalignments (each designed misalignment is between at least two overlapping periodic structures in the respective target cell). Inaccuracies which are related to the designed misalignments are reduced, process variation sources are detected and targets and measurement algorithms are optimized according to the derived dependency.

In the case of scatterometry overlay metrology, there exist different sources of inaccuracy. For example, in the case of first order scatterometry overlay metrology, four cells are needed to extract the overlay signal: two cells in each direction with an induced offset of $+f_0$ for the first cell, and $-f_0$ for the second cell. In terms of process, the inaccuracy sources may be due to inter-cell (between cells) or intra-cell (within the cell) variations. A non-limiting example for an inter-cell inaccuracy is a small variation in the thickness in one or more layers from one cell to another. Such inaccuracy results in an associated per-pixel amplitude variation in the differential signal D ($\vec{k}, \pm f_0$) between the diffraction orders of the two cells in the pupil image. The differential signal for each cell with an induced offset of $\pm f_0$ is expressed in Equation 1:

$$D(\vec{k}, \pm f_0) = [A(\vec{k}) + \delta A_{\mp f_0}(\vec{k})] g\left[\frac{2\pi(OVL \pm f_0)}{P}\right] \qquad \text{Equation 1}$$

in which A ($\vec{k}$) is the per-pixel amplitude, OVL the overlay between the current and the previous grating in the target, P the pitch (periodicity) of the grating, and g is a function depending on the overlay algorithm. An amplitude variation between the cells due to this inter-cell process variation leads therefore to an inaccuracy in the measurements.

Before continuing, it is noted that the following derivation may be applicable to multiple sources of inaccuracy and may be used to quantify any of them. Furthermore, while the target is referred to as comprising gratings, any periodic structures may be used to evaluate overlays between the target cell layers. Targets may comprise more than two layers, and the following derivation and algorithms may be modified accordingly.

Incorporating the expression for the differential signal (Equation 1) in the overlay measurement algorithm leads to the following overlay inaccuracy estimation, expressed as Equation 2:

$$\text{Inaccuracy}(\vec{k}) = \frac{f_0}{2}\left(\frac{\delta A}{A}\right)\left[\left(\frac{OVL}{f_0}\right)^2 - 1\right] \qquad \text{Equation 2}$$

The relationship expressed in Equation 2 exhibits a linear behavior of the measured inaccuracy with $f_0$ under the assumption that $OVL \ll f_0$. The influence of these inter-cell process variations can be considered to be critical when $$\left(\frac{\delta A}{A}\right) > 10\%.$$

In such cases it becomes crucial to identify the presence and the cause of the inaccuracy by a proper choice of target designs.

In order to identify the presence of inaccuracy sources due to inter-cell process variations, the inaccuracy property expressed in Equation 2 may be measured. Considering the variation of the inaccuracy ($\Delta$Inaccuracy) with the variation in $f_0$ ($\Delta f_0$), Equation 2 may be expanded to obtain the following dependency of the inaccuracy on $f_0$, expressed in Equation 3:

$$\Delta(\text{Inaccuracy}(\vec{k}), f_0) \cong \frac{\Delta f_0}{f_0} \text{Inaccuracy}(\vec{k}) \qquad \text{Equation 3}$$

Hence, in presence of an inter-cell process variation (of any sort), the measured inaccuracy is approximately linear with $f_0$.

FIGS. 1A-1E are high level schematic illustrations of targets 100, according to some embodiments of the invention. Each of cells 90 comprises at least two overlapping periodic structures 80, such as gratings with pitch P, designed to have an offset of $f_0$ along the direction of periodicity. In certain embodiments, as illustrated e.g., in FIG. 1A, targets 100 having at least three cells 90 having different $f_0$'s may be used to identify inaccuracies in the measurement due to inter-cell process variation. Certain embodiments, as illustrated e.g., in FIG. 1B, comprise target 100 comprising a single cell 90 having $f_0=0$ and a target design of P/4. For $f_0=0$, the difference between two differential signals (D1-D2) as expressed by Equation 1 is $2\delta A \times OVL$ instead of zero in the ideal case (where there is no inaccuracy). Hence, a single cell may permit identification of cell to cell variation. Such target may also be used for the identification of the inaccuracy source.

In each cell of SCOL target the relative offset between the two gratings, can be divided to the intended term and the uncontrolled term. The first term is usually chose to be opposite between the two cells of the target (marked as $mis_1=f_0$ and $mis_2=-f_0$ for the first and second cell, respectively). The latter term is the OVL that the metrology should report. FIGS. 1C and 1D schematically illustrate targets 100 comprising at least four cells 90 having different misregistration values $Mis_n$, and FIG. 1E schematically illustrates target 100 comprising two distinct targets 100A, 100B; both options are discussed in further detail below. It is emphasized that any of the designs of targets 100 may be extended to two dimensional targets, applying the illustrated one dimensional design principles to two dimensions.

Figure 3B:
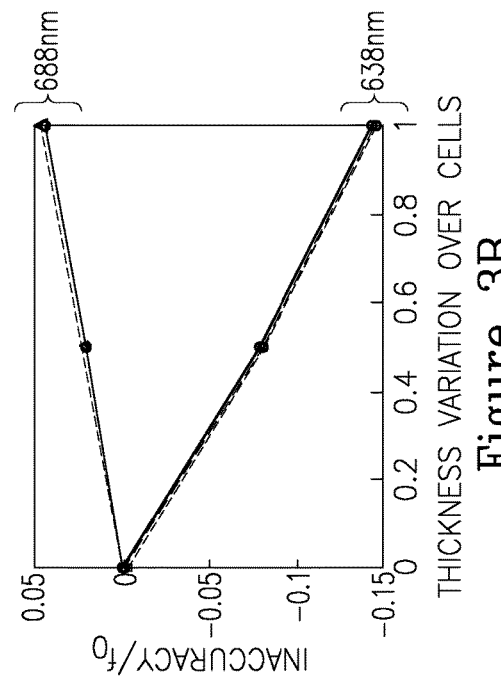
Figure 2:
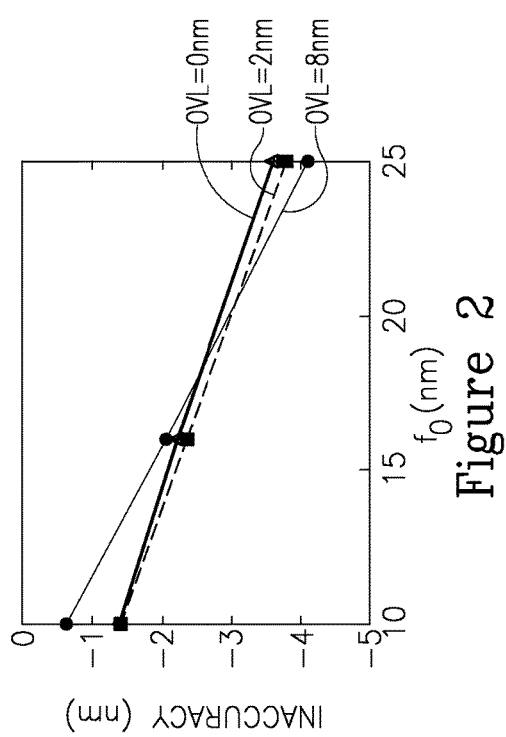
FIG. 2 is a graphical representation of simulation results for the inaccuracy as a function of the induced offset in targets with varying layer thickness between the target cells, according to some embodiments of the invention.

The analysis presented above was validated by simulation with the following results. FIGS. 2, 3A and 3B illustrate simulation results for targets with varying layer thickness between the two target cells 90 having different $f_0$'s. This thickness variation was varied in the simulation from 0 to 1 nm by steps of 0.5 nm. Different overlays were calculated for different induced $f_0$ offset values of 10, 16, and 25 nm. The inaccuracy is calculated as the difference between the output overlays obtained by simulation and the input overlay. FIG. 2 illustrates the inaccuracy as a function of the induced $f_0$ for different overlay values OVL=0, 2, and 8 nm. FIGS. 3A and 3B illustrate the linear behavior of the inaccuracy as a function of the thickness variation induced across the cells. In FIG. 3B, the inaccuracy is divided by the corresponding $f_0$ to highlight the similar behavior of the inaccuracy that signifies the same cause of inaccuracy; in this case pad-to-pad variation. The identification of the cause of inaccuracy by the linearity with $f_0$ provides an estimation of the inter-cell (pad-to-pad) thickness variation in respective cases, or of other inter-cell variation sources. It is further noted that the standard deviation of the measured OVL is also linear with the $f_0$ offset, a finding which may be used to identify process variation like pad to pad variation.

Certain embodiments comprise complementary algorithms of estimating and eliminating the contribution of cell to cell variation, expressed by the term $\delta A_{\mp f_0}(\vec{k})$ in Equation 1, to the overlay measurement inaccuracy.

In certain embodiments, targets 100 having more than two cells 90 per direction may be used. The additional cells may have different intended misregistration values $Mis_n$. The minimal number of cells is four, as explained below and illustrated in FIG. 1C. Additional cells may improve the results. For example, additional SCOL targets (having opposite designed misalignments) may be printed next to target 100 with different $f_0$ values, as illustrated in FIG. 1D. In targets 100, each pair of cells 90 is a valid overlay target having the parameter $f_0$ being half the difference between the intended misregistration values between the cells ($Mis_n - Mis_m$)/2. In addition there is another term of common intended OVL for the pair of cell which is half the sum of the respective intended misregistration values ($Mis_n + Mis_m$)/2. For a total number N of cells 90 in target 100, there are N+1 unknown parameters: N $A_n$ parameters of the different cells (per-pixel amplitude per cell n, see Equation 1) plus the accurate overlay OVL. As for the N cells 90 the total number of independent overlay measurements is N(N−1)/2 (all pair combinations), targets 100 having N≥4 cells provide enough equations to calculate all the required parameter values and specifically the (common) accurate OVL value. Hence, these measurements may be used to estimate the inaccuracy due to pad to pad variations as well as to calculate and report the accurate OVL value.

For example, two SCOL targets may be used to provide target 100 with four cells 90 (see FIG. 1C, specific example below the target illustration), in which, for example, $f_0(1)=15$ nm and $f_0(2)=25$ nm. Under the assumption $OVL \ll f_0$, the four cell pairs for overlay measurements are expressed by $P_1$, $P_2$, $P_3$, $P_4$ defined by Equations 4:

$$\begin{cases} P_1 = C_{25}, C_{-25} \\ P_2 = C_{15}, C_{-15} \\ P_3 = C_{25}, C_{-15} \\ P_4 = C_{15}, C_{-25} \end{cases} \quad \text{Equations 4}$$

Here, $C_x$ is the cell with intended OVL of x (in nm).

Equation 2 can be written as Equation 5:

$$Inaccuracy_{n,m}(\vec{k}) = f_0(n,m)\left(\frac{\delta A_n(\vec{k})}{2A(\vec{k})} - \frac{\delta A_m(\vec{k})}{2A(\vec{k})}\right) \quad \text{Equation 5}$$

The parameter $f_0$ of each pair is half the intended OVL between the cells (($Mis_n - Mis_m$)/2). The cells' qualities are described by the parameter $$\chi : \chi_n \equiv \frac{\delta A_n(\vec{k})}{2A(\vec{k})}.$$

Using it, the different pair parameters are expressed in Equations 6:

$$\begin{cases} OV_1 = 0; f_0 = 25; Inac_1 = 25\frac{1}{A}(\chi_{25} - \chi_{-25}) \\ OV_2 = 0; f_0 = 15; Inac_2 = 15\frac{1}{A}(\chi_{15} - \chi_{-15}) \\ OV_3 = 5; f_0 = 20; Inac_3 = 20\frac{1}{A}(\chi_{25} - \chi_{-15}) \\ OV_4 = -5; f_0 = 20; Inac_4 = 20\frac{1}{A}(\chi_{15} - \chi_{-25}) \end{cases} \quad \text{Equations 6}$$

with $OV_n$ being the difference between the OVL of the $n_{th}$ pair OVL and the common OVL. ($OV_n = (Mis_n + Mis_m)/2$) Since the inaccuracy source is the difference between the cells' qualities one of the parameters $\chi$ may be chosen as zero, e.g., $\chi_{25}=0$.

Using the accurate overlay denoted as OVL (which is the common to all cells) and the four measured OVL values (denoted $MeasOVL_n$) the following linear equation system results in Equations 7:

$$\begin{cases} MeasOVL_1 = OVL + 25\frac{1}{A}(-\chi_{-25}) \\ MeasOVL_2 = OVL + 15\frac{1}{A}(\chi_{15} - \chi_{-15}) \\ MeasOVL_3 = OVL + 5 + 20\frac{1}{A}(-\chi_{-15}) \\ MeasOVL_4 = OVL - 5 + 20\frac{1}{A}(\chi_{15} - \chi_{-25}) \end{cases} \quad \text{Equations 7}$$

There are four linear equations with four unknown parameters which can be easily solved to yield the accurate overlay OVL and the relative cell amplitudes.

Certain embodiments use Equation 2 in order to estimate the inaccuracy due to process variations across cells 90. The overlay may be measured from two distinct targets 100A, 100B which differ in $f_0$, as illustrated in FIG. 1E. The OVL extracted by each of those target are $OVL_{f0,1}$ for the OVL extracted with target 100A with $f_{0,1}$; and $OVL_{f0,2}$ for the OVL extracted with target 100B with $f_{0,2}$. Equation 2 may be expressed as two equations, Equations 2A, 2B, for respective targets 100A, 100B:

$$OVL_{f0,1} = OVL_{real} + f_{0,1}\left(\frac{\delta A}{A}\right)\left[\left(\frac{OVL_{real}}{f_{0,1}}\right)^2 - 1\right] \quad \text{Equation 2A}$$

$$OVL_{f0,2} = OVL_{real} + f_{0,2}\left(\frac{\delta A}{A}\right)\left[\left(\frac{OVL_{real}}{f_{0,2}}\right)^2 - 1\right] \quad \text{Equation 2B}$$

Subtracting Equation 2B from Equation 2A results in Equation 8:

$$\left(\frac{\delta A}{A}\right) = \frac{OVL_{f0,1} - OVL_{f0,2}}{f_{0,2} - f_{0,1} + OVL_{real}^2\left(\frac{f_{0,2} - f_{0,1}}{f_{0,2} \cdot f_{0,1}}\right)} \quad \text{Equation 8}$$

By an appropriate choice of the designed offsets $f_{0,2}$, $f_{0,1}$, (for example, 16 nm and 25 nm), Equation 7 may be approximated to Equation 8 (with the quality of the approximation depending on the selection of the designed offsets with respect to the expected OVL, i.e.

$$\left(\frac{OVL_{real}^2}{f_{0,2} \cdot f_{0,1}}\right) \ll 1\right):$$

$$\left(\frac{\delta A}{A}\right) = \frac{OVL_{f0,1} - OVL_{f0,2}}{f_{0,2} - f_{0,1}} \quad \text{Equation 8}$$

Figure 4:
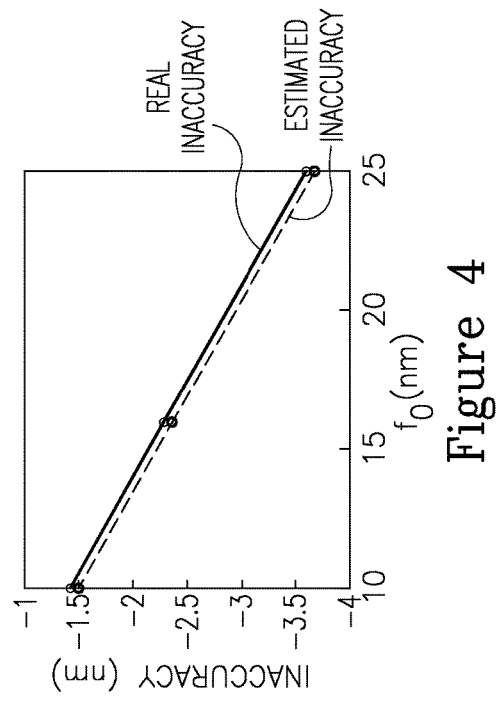
FIG. 4 is a graphical representation of simulation results that illustrate the approximate estimation of the inaccuracy compared to the actual simulated inaccuracy, according to some embodiments of the invention.

FIG. 4 presents simulation results that illustrate the estimation of the inaccuracy by Equation 8 and the accuracy of the approximation by comparison to the actual simulated inaccuracy, according to some embodiments of the invention.

Certain embodiments comprise metrology target 100 comprising at least three target cells 90 having different designed misalignments, wherein each designed misalignment is between at least two overlapping periodic structures in the respective target cell. Metrology target 100 may comprise at least four target cells 90 having different designed misalignments, at least two of which being SCOL target cells having opposite designed misalignments or at least four of which being SCOL target cells of at least two SCOL targets having opposite designed misalignments. In certain embodiments, metrology target 100 may comprise at least two cells with a bar-over-bar design and opposite induced offsets, and at least two cells with a trench-over-bar design and opposite induced offsets, with the cell pairs being half a pitch apart. This configuration may be seen as two SCOL targets (with two cells each) or as a single four cell SCOL target. The misalignments in the cells may be selected to comprise $+f_0$, $-f_0$, $P/2+f_0$ and $P/2-f_0$. The overlays may be derived from the first pair ($+f_0$ and $-f_0$) and from the second pair ($P/2+f_0$ and $P/2-f_0$) and be averaged to reduce some of the inaccuracy. The two overlay values may be averaged with an appropriate weight that is derived from the overlay sensitivity of each pair of cells which may be calculated as explained above.

Certain embodiments comprise target design files of metrology target 100 and overlay measurements assembly (ies) of metrology target 100.

Certain embodiments identify and correct important inaccuracy sources that are independent of both the overlay and the induced $f_0$ shift (e.g., grating asymmetry) in case of metrology measurement of overlay by scatterometry. Inaccuracy sources may be identified, which result in an apparent mismatch between two target designs with an induced offsets of P/1 and P/2, where P is the pitch of the grating; the identified mismatch may be corrected by averaging the signal between the two targets; and new single target designs may be suggested, which permit to optically reduce the inaccuracy.

Small variations in the process may cause significant inaccuracy during the measurement that may lead the metrology engineer to erroneous conclusion concerning the recipe selection or wafer rejection. This is especially the case when focusing on an inaccuracy source that is independent of the overlay and the induced $f_0$ shift (the inaccuracy is redundant with the grating period). A good example of such inaccuracy is grating asymmetry occurring when the side wall angle (SWA) on the left side is different from the SWA on the right side. The measured overlay of such asymmetric grating is the sum of the real overlay, the ambiguity, and the inaccuracy, which may be expressed in Equation 9.

$$OVL_{measured} = OVL_{real} + \text{ambiguity} + \text{Inaccuracy}_{asymmetry} \quad \text{Equation 9}$$

In four-cell scatterometry overlay technology (SCOL) technology, the metrology tool measures the diffracted order of the two cells (two cells per directions) where the cells are designed to have induced offsets of respectively $+f_0$ and $-f_0$. Then the overlay is extracted by calculating the differential signal between the +1 and the −1 diffraction orders for each cell. The differential signal per pixel may be expressed by Equation 1 presented above.

The introduction of an OVL-independent and an $f_0$-independent process variation in the target results in an additional term $B(\vec{k})$ in the differential signal:

$$D(\vec{k}, \pm f_0) = A(\vec{k})\sin\left[\frac{2\pi(OVL + F \pm f_0)}{P}\right] + B(\vec{k}) \quad \text{Equation 10}$$

This additional term is responsible for the global inaccuracy obtained during the measurement. It should be noted that this inaccuracy also contains the ambiguity mentioned in Equation 9 such that Inacuracy=ambiguity+Inaccuracy$_{asymmetry}$.

Incorporating Equation 10 into the Overlay measurement algorithm, the inaccuracy resulting from $B(\vec{k})$ can be calculated and expressed as Equation 11:

$$\text{Inaccuracy}(\vec{k}) \sim \frac{P}{4\pi}\frac{B(\vec{k})}{A(\vec{k})}f\left\{\frac{2\pi(OVL + F_0)}{P}\right\} \quad \text{Equation 11}$$

With f being an even function of the pitch, F being related to the target design and is either equal to P/1 for a bar-over-bar target design or to P/2 for a trench-over-bar target design.

The result expressed as Equation 11 has several significant impacts. First, the inaccuracy is independent of $f_0$ and second, Equation 11 predicts a sign flipping of the inaccuracy between the two targets, as expressed in Equations 12. For a target having two cells: a first cell with F=P/1 and $+f_0$; and a second cell with F=P/2 and $-f_0$; the differential signals D1, D2 (Equation 10) would be:

$$D1 = (A+\delta A)\sin\left|\frac{2\pi(OVL+f_0)}{P}\right| \sim (A+\delta A)\cdot(OVL+f_0)$$

$$D2 = (A-\delta A)\sin\left|\frac{\pi(OVL-f_0)}{P}\right|$$

$$= (-A+\delta A)\sin\left|\frac{2\pi(OVL-f_0)}{P}\right| \sim (-A+\delta A)\cdot(OVL-f_0)$$

Equations 12

Certain embodiments, resting upon those theoretical formulations, permit to identify a specific inaccuracy cause and to extract the real inaccuracy by measuring the overlay on two targets with F=P/1 and F=P/2. Certain embodiments further permit to calculate the real overlay by constructing an effective differential signal as presented in Equation 13.

$$D(\vec{k},\pm f_0)=1/2(D(\vec{k},\pm f_0;F=P/1)+D(\vec{k},\pm f_0;F=P/2))$$ Equation 13

The inaccuracy in case of sign flipping on the measurement between the two differentials may further be cancelled by averaging it between the two targets. In case of multiple inaccuracy causes, the inaccuracy due to grating asymmetry is cancelled by averaging over the two targets as in expressed in Equation 14.

Inaccuracy(k)=(Inaccuracy(k;F=P/1)+Inaccuracy(k; F=P/2)) Equation 14

Figure 5:
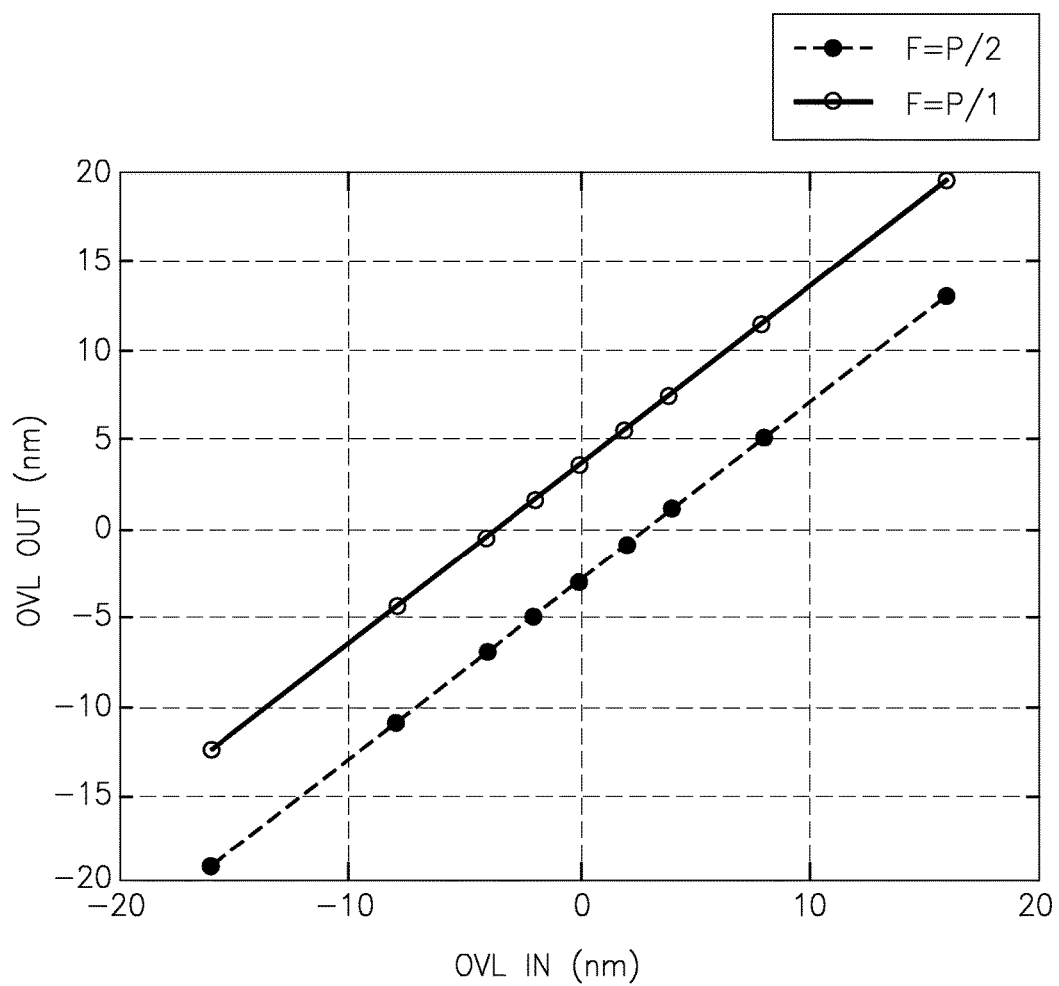
FIG. 5 is a graphical representation of simulation results using the overlay calculation algorithm on a grating over grating resist over silicon target that exhibits grating asymmetry in the previous silicon layer, according to some embodiments of the invention; and, FIG. 6 is a high level schematic flowchart of a method, according to some embodiments of the invention.

FIG. 5 presents simulation results using the overlay calculation algorithm on a grating over grating resist over silicon target that exhibits grating asymmetry in the previous silicon layer, according to some embodiments of the invention. The simulations were based on Rigorous Coupled Wave Analysis (RCWA) and performed to investigate the results of the derivation presented in Equations 10-14. The asymmetry was introduced by inserting a slight angular difference between the left SWA and the right SWA of the previous grating. Simulations were realized for different designed overlay. FIG. 5 shows the overlay as extracted by the SCOL algorithm as a function of the designed overlay. FIG. 5 presents the results obtained both for F=P/1 (upper line) and for F=P/2 (lower line). At OVL=0, the inaccuracy is ca. 3 nm for F=P/1 and ca. −3 nm for F=P/2 which about cancel out. Hence, averaging the overlay signals of the two target designs significantly reduces the inaccuracy. In the case the target does not possesses any other inaccuracy sources, this inaccuracy is reduced to zero by the presented configuration.

Certain embodiments use P/1 and P/2 targets to identify inaccuracy due to grating asymmetry and reduce the inaccuracy by an adequate averaging. Targets with more than two cells may be used according to the disclosed principles to refine the estimations of the inaccuracy in case of grating asymmetry. In certain embodiments, the metrology target may comprise at least two cells with a bar-over-bar design and opposite induced offsets, and at least two cells with a trench-over-bar design and opposite induced offsets, i.e., the misalignments in the cells may be selected to comprise $+f_0$, $-f_0$, $P/2+f_0$ and $P/2-f_0$. The overlays may be derived from the first pair ($+f_0$ and $-f_0$) and from the second pair ($P/2+f_0$ and $P/2-f_0$) and be averaged to reduce some of the inaccuracy. The two overlay values may be averaged with an appropriate weight that is derived from the overlay sensitivity of each pair of cells which may be calculated as explained above. Similar target design and algorithm derivation may be applied to any type of cell to cell variation. Certain embodiments may be applied to estimate and cancel out the inaccuracy resulting from pad to pad variation.

Figure 6:
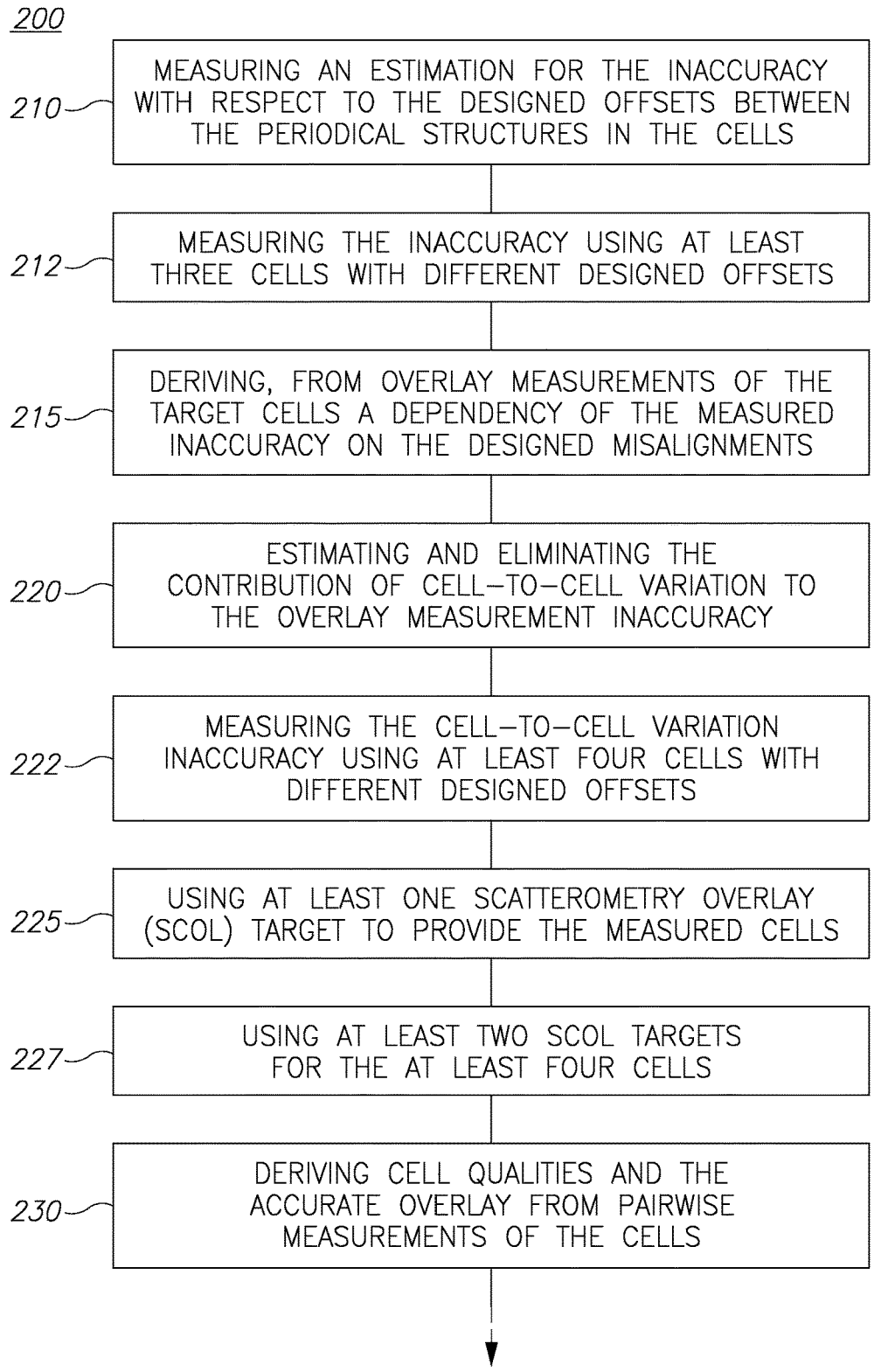

FIG. 6 is a high level schematic flowchart of a method 200, according to some embodiments of the invention. Method 200 may be at least partially implemented by at least one computer processor, e.g., in a metrology module or in a target design module.

Method 200 may comprise a metrology method comprising estimating inter-cell process variation (stages 210) by deriving (stage 215), from overlay measurements of at least three target cells having different designed misalignments (stage 212), a dependency of a measured inaccuracy on the designed misalignments, wherein each designed misalignment is between at least two overlapping periodic structures in the respective target cell. Method 200 may further comprise eliminating the inter-cell process variation inaccuracy from the overlay measurements (stage 220). Deriving 215 may be carried out with respect to at least four target cells with different designed offsets (stage 222). At least two of the cells may be scatterometry overlay (SCOL) target cells having opposite designed misalignments (stage 225) or at least four of the cells may be SCOL target cells of at least two SCOL targets having opposite designed misalignments (stage 227).

Method 200 may further comprise deriving cell qualities with respect to the process variation and an accurate overlay from pairwise overlay measurements of the cells (stage 230). Method 200 may further comprise selecting the designed misalignments to enhance an approximation quality of the estimation (stage 240), for example to have a product of the misalignments which is at least ten time the squared overlay. Method 200 may further comprise estimating the inaccuracy across cells (stage 245)

Method 200 may comprise carrying out the estimation in two directions with respective overlay measurements of at least three target cells in each direction (stage 247).

In certain embodiments, method 200 comprises identifying and correcting inaccuracy sources that are independent of both the overlay and the induced $f_0$ shift (stage 250), using target designs with induced offsets of a full pitch and half a pitch (stage 260), correcting the identified mismatch by averaging the signal between the two targets (stage 262) and/or suggesting new single target designs that optically reduce the inaccuracy (stage 270). In certain embodiments, in stages 225 and/or 227 the opposite designed misalignments of the at least two pairs of SCOL target cells (or at least two SCOL targets) may be half a pitch apart, i.e., the misalignments in the cells may be selected to comprise $+f_0$, $-f_0$, $P/2+f_0$ and $P/2-f_0$. The overlays may be derived from the first pair ($+f_0$ and $-f_0$) and from the second pair ($P/2+f_0$ and $P/2-f_0$) and be averaged to reduce some of the inaccuracy. The two overlay values may be averaged with an appropriate weight that is derived from the overlay sensitivity of each pair of cells which may be calculated as explained above.

Certain embodiments comprise a metrology module configured to carry out method 200 partially or fully. Certain embodiments comprise a computer program product comprising a computer readable storage medium having computer readable program embodied therewith, which is configured to carry out any one of the stages of method 200.

In certain embodiments, method 200 may comprise designing an inaccuracy target (stage 280) to comprise at least three target cells having different designed misalignments, wherein each designed misalignment is between at least two overlapping periodic structures in the respective target cell. The inaccuracy target may be designed to have at least four target cells having different designed misalignments. Method 200 may further comprise incorporating SCOL targets in the designed inaccuracy targets (stage 285), for example, designing the inaccuracy target with at least two of the cells being SCOL target cells having opposite designed misalignments, or with at least four of the cells being SCOL target cells of at least two SCOL targets having opposite designed misalignments.

Method 200 may further comprise deriving a target design file of the inaccuracy target (stage 290) and/or producing the inaccuracy target (stage 292) and/or measuring overlays of the produced target cells (stage 294). Method 200 may further comprise deriving from the overlay measurements a dependency of a measured inaccuracy on the designed misalignments of the inaccuracy target (stage 215).

Advantageously, the methods, algorithms and targets relate inaccuracies to the designed misalignments and reduced them, detect process variation sources and optimize targets and measurement algorithms, while prior art knowledge lacks any direct method to identify whether or not pad-to-pad variations effects the measurement accuracy, nor any way to handle targets with different designed misalignments Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

The invention is not limited to those diagrams or to the corresponding descriptions. For example, flow need not move through each illustrated box or state, or in exactly the same order as illustrated and described.

Thus, it is seen that the objects of the present invention are efficiently obtained, although modifications and changes to the invention should be readily apparent to those having ordinary skill in the art, which modifications are intended to be within the spirit and scope of the invention as claimed. It also is understood that the foregoing description is illustrative of the present invention and should not be considered as limiting. Therefore, other embodiments of the present invention are possible without departing from the spirit and scope of the present invention as claimed.

What is claimed is:

1. A system comprising:
   a scatterometry overlay tool configured to acquire a set of overlay measurements from three or more target cells having different preselected induced offsets; and
   one or more processors communicatively coupled to the scatterometry overlay tool, wherein the one or more processors are configured to execute a set of program instructions stored in memory, wherein the set of program instructions are configured to cause the one or more processors to:
   determine one or more measurement inaccuracies in the set of overlay measurements, wherein the one or more measurement inaccuracies comprise estimated inaccuracies in the set of overlay measurements caused by one or more process variations; and
   derive, from the set of overlay measurements acquired from the three or more target cells having different preselected induced offsets, a dependency of one or more of the one or more measurement inaccuracies on at least one of the preselected induced offsets,
   wherein a first target cell has a first preselected induced offset, a second target cell has a second preselected induced offset, and at least a third target cell has at least a third preselected induced offset,
   wherein a particular preselected induced offset associated with a particular target cell is between two or more overlapping periodic structures in the particular target cell.

2. The system of claim 1, wherein the set of overlay measurements are taken at a pupil plane.

3. A metrology method, comprising:
   acquiring a set of overlay measurements from three or more target cells having different preselected induced offsets, wherein a first target cell has a first preselected induced offset, a second target cell has a second preselected induced offset, and at least a third target cell has at least a third preselected induced offset;
   determining one or more measurement inaccuracies in the set of overlay measurements, wherein the one or more measurement inaccuracies comprise estimated inaccuracies in the set of overlay measurements caused by one or more process variations; and
   deriving, from the set of overlay measurements acquired from the three or more target cells having different preselected induced offsets, a dependency of at least one of the one or more measurement inaccuracies on at least one of the preselected induced offsets, wherein a particular preselected induced offset associated with a particular target cell is between two or more overlapping periodic structures in the particular target cell.

4. The metrology method of claim 3, further comprising: eliminating inter-cell process variation inaccuracy from the overlay measurements.

5. The metrology method of claim 3, wherein the dependency of the one or more measurement inaccuracies on the induced offsets is derived with respect to four or more target cells.

6. The metrology method of claim 5, wherein two or more of the cells are scatterometry overlay (SCOL) target cells having opposite induced offsets.

7. The metrology method of claim 5, wherein four or more of the cells are SCOL target cells of two or more SCOL targets having opposite induced offsets.

8. The metrology method of claim 7, wherein the opposite induced offsets of the two or more SCOL targets are half a pitch apart.

9. The metrology method of claim 3, further comprising: deriving one or more cell qualities with respect to a process variation and an accurate overlay from pairwise overlay measurements of the cells.

10. The metrology method of claim 3, further comprising: selecting the induced offsets to enhance an approximation quality of the estimation.

11. The metrology method of claim 10, wherein the induced offsets are selected to have a product that is at least ten times the squared overlay.

12. The metrology method of claim 3, wherein the dependency of the one or more measurement inaccuracies is derived according to:

$$\text{Inaccuracy}(\vec{k}) = \frac{f_0}{2}\left(\frac{\delta A}{A}\right)\left[\left(\frac{OVL}{f_0}\right)^2 - 1\right].$$

13. The metrology method of claim 3, wherein the overlay measurements are taken at a pupil plane.

14. A method, comprising:
designing, with one or more processors, an inaccuracy target to comprise three or more target cells having different preselected induced offsets, wherein a first target cell has a first preselected induced offset, a second target cell has a second preselected induced offset, and at least a third target cell has at least a third preselected induced offset, wherein a particular preselected induced offset associated with a particular target cell is disposed between two or more overlapping periodic structures in the particular target cell, wherein two or more of the first preselected induced offset, the second preselected induced offset, and the third preselected induced offset comprise opposite induced offsets;
measuring one or more overlay values of the produced target cells, and
deriving, from the one or more overlay values, a dependency of one or more measurement inaccuracies on at least one of the preselected induced offsets of the inaccuracy target, wherein the one or more measurement inaccuracies comprise estimated inaccuracies in the one or more measured overlay values caused by one or more process variations.

15. The method of claim 14, wherein the inaccuracy target is designed to have four or more target cells having different induced offsets.

16. The method of claim 15, wherein two or more of the cells are scatterometry overlay (SCOL) target cells having opposite induced offsets.

17. The method of claim 16, wherein the opposite induced offsets of the two or more SCOL targets are half a pitch apart.

18. The method of claim 14, further comprising:
generating a target design file of the inaccuracy target.

19. The method of claim 18, further comprising:
producing the inaccuracy target.

20. The method of claim 19, wherein the one or more overlay values include a set of overlay measurements from the three or more target cells having different preselected induced offsets.

21. The method of claim 14,
wherein the dependency of one or more measurement inaccuracies is derived according to:

$$\text{Inaccuracy}(\vec{k}) = \frac{f_0}{2}\left(\frac{\delta A}{A}\right)\left[\left(\frac{OVL}{f_0}\right)^2 - 1\right].$$

* * * * *